(12) United States Patent
Sato

(10) Patent No.: US 10,228,616 B2
(45) Date of Patent: Mar. 12, 2019

(54) IMPRINT APPARATUS AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/300,845

(22) PCT Filed: May 15, 2015

(86) PCT No.: PCT/JP2015/064668
§ 371 (c)(1),
(2) Date: Sep. 30, 2016

(87) PCT Pub. No.: WO2015/190259
PCT Pub. Date: Dec. 17, 2015

(65) Prior Publication Data
US 2017/0023857 A1    Jan. 26, 2017

(30) Foreign Application Priority Data
Jun. 9, 2014    (JP) ................................. 2014-119110

(51) Int. Cl.
*G03F 9/00* (2006.01)
*G03F 7/00* (2006.01)

(52) U.S. Cl.
CPC .......... *G03F 7/0002* (2013.01); *G03F 9/7042* (2013.01)

(58) Field of Classification Search
CPC ............................. G03F 7/0002; G03F 9/7023
(Continued)

(56) References Cited

U.S. PATENT DOCUMENTS 4,166,541 A * 9/1979 Smith, Jr. ............... G06T 7/001
101/484
7,803,308 B2 * 9/2010 GanapathiSubramanian ............
G03F 7/0002
264/220

(Continued)

FOREIGN PATENT DOCUMENTS

CN       103048879 A    4/2013
JP       2003163158 A    6/2003

(Continued)

OTHER PUBLICATIONS

International Search Report issued in Intl. Appln. No. PCT/JP2015/064668 dated Oct. 6, 2015.

(Continued)

*Primary Examiner* — Anthony Nguyen
(74) *Attorney, Agent, or Firm* — Rossi, Kimms & McDowell LLP

(57) ABSTRACT

The present invention provides an imprint apparatus which performs an imprint process of forming a pattern on a substrate by molding an imprint material on the substrate using a mold, the apparatus including a measurement unit configured to measure relative positions of the mold and the substrate, a light source unit configured to emit light for curing the imprint material, a scanning unit configured to scan light from the light source unit on the substrate, and a control unit configured to control the imprint process, wherein the control unit performs the imprint process by causing the scanning unit to scan the light while partially aligning the mold and the substrate with each other based on a measurement result of the measurement unit.

16 Claims, 6 Drawing Sheets

(58) Field of Classification Search
USPC .......................................................... 101/130
See application file for complete search history.

(56) References Cited

U.S. PATENT DOCUMENTS

| | | | |
|---|---|---|---|
| 7,832,416 B2 * | 11/2010 | Wang .................... | B29C 43/021 134/61 |
| 8,556,616 B2 | 10/2013 | Resnick et al. | |
| 9,372,396 B2 | 6/2016 | Kruijt-Stegeman et al. | |
| 2002/0170880 A1 * | 11/2002 | Chen ....................... | B82Y 10/00 216/52 |
| 2007/0248892 A1 * | 10/2007 | Rangelow ............. | G03F 9/7038 430/5 |
| 2009/0170014 A1 * | 7/2009 | Shibazaki ............... | G03F 7/201 430/5 |
| 2010/0231923 A1 * | 9/2010 | Ge ...................... | G01B 11/2441 356/511 |
| 2011/0084417 A1 | 4/2011 | Choi et al. | |
| 2011/0151124 A1 * | 6/2011 | Ina ......................... | B82Y 10/00 427/277 |
| 2011/0206852 A1 * | 8/2011 | Shiode .................. | B82Y 10/00 427/356 |
| 2012/0001978 A1 * | 1/2012 | Burke ................... | B41J 11/009 347/19 |
| 2013/0015597 A1 | 1/2013 | Hattori | |
| 2013/0078820 A1 | 3/2013 | Mikami | |
| 2013/0221581 A1 | 8/2013 | Yoneda | |
| 2013/0260110 A1 | 10/2013 | Yasukochi | |

FOREIGN PATENT DOCUMENTS

| | | | |
|---|---|---|---|
| JP | 2006005022 A | 1/2006 |
| JP | 2006188054 A | 7/2006 |
| JP | 2007272066 A | 10/2007 |
| JP | 2007280993 A | 10/2007 |
| JP | 2009536591 A | 10/2009 |
| JP | 2010098310 A | 4/2010 |
| JP | 2013069919 A | 4/2013 |
| KR | 1020130009630 A | 1/2013 |
| KR | 1020130040727 A | 4/2013 |
| TW | 201139118 A1 | 11/2011 |

OTHER PUBLICATIONS

Written Opinion issued in Intl. Appln. No. PCT/JP2015/064668 dated Oct. 6, 2015.
Office Action issued in Taiwanese Appln. No. 104116249 dated Jul. 19, 2017. English translation provided.
Notice of Preliminary Rejection issued in Korean Appln. No. 10-2016-7036489 dated Nov. 22, 2017.
Office Action issued in Chinese Appln. No. 201580030048.X dated Sep. 10, 2018. English Translation provided.
Office Action issued in Japanese Application No. 2014-119110 dated May 14, 2018.

* cited by examiner

FIG. 5A
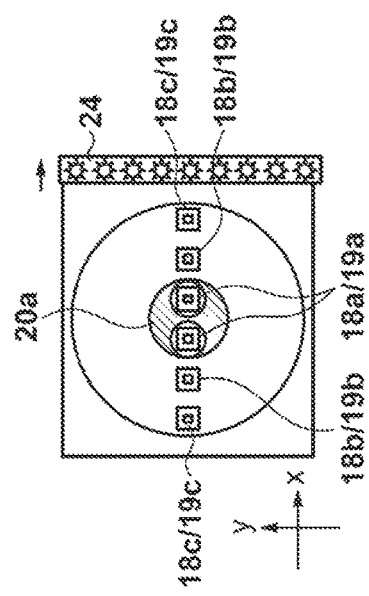
FIG. 5B
FIG. 5C
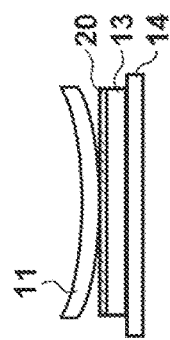
FIG. 5D
FIG. 5E
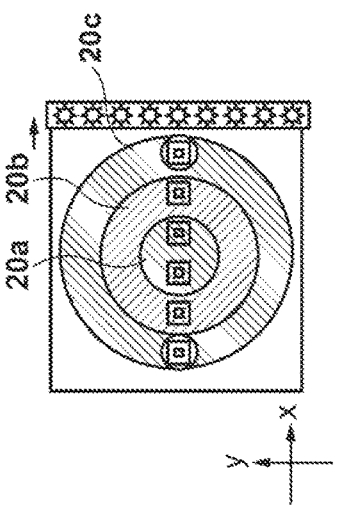
FIG. 5F

IMPRINT APPARATUS AND METHOD OF MANUFACTURING ARTICLE

TECHNICAL FIELD

The present invention relates to an imprint apparatus and a method of manufacturing an article.

DESCRIPTION OF THE RELATED ART

An imprint technique can transfer a nanoscale fine pattern, and is proposed in Japanese Patent Laid-Open No. 2010-98310 as one of nanolithography techniques for volume production of semiconductor devices and magnetic storage media. An imprint apparatus using the imprint technique cures a resin (imprint material) on a substrate in a state in which a mold (die) on which a pattern has been formed and the resin are in contact with each other, and releases the mold from the cured resin, thereby forming a pattern on the substrate. The imprint apparatus generally adopts, as a resin-curing method, a photo-curing method of curing the resin on the substrate by irradiation with light such as ultraviolet light.

As a technique concerning ultraviolet-light irradiation, Japanese Patent Laid-Open Nos. 2003-163158 and 2007-280993 propose a technique of forming a compact light source by light emitting devices such as laser diodes (LEDs) which emit ultraviolet light and scanning the light source. Japanese Patent Laid-Open No. 2003-163158 discloses a technique, in a semiconductor exposure apparatus, of irradiating a predetermined region with light (exposure light) by scanning the light source formed by two-dimensionally arraying the plurality of light emitting devices in one direction. In Japanese Patent Laid-Open No. 2003-163158, stable exposure-light irradiation is implemented by guiding a part of exposure light to a light receiver to measure a light amount. On the other hand, Japanese Patent Laid-Open No. 2007-280993 discloses a technique, in a hologram exposure apparatus, of performing light irradiation by scanning the light source while measuring the spacing between a hologram mask and the film surface of a photosensitive material. Japanese Patent Laid-Open No. 2007-280993 is characterized by changing the spacing between the hologram mask and the film surface of the photosensitive material, and scanning the light source at least one by one.

However, Japanese Patent Laid-Open Nos. 2003-163158 and 2007-280993 do not consider control regarding the relative displacement between the mask and the substrate in a direction parallel to the surface of the substrate during exposure, that is, while scanning the light source formed by the LEDs or the like. Therefore, if the technique disclosed in Japanese Patent Laid-Open Nos. 2003-163158 and 2007-280993 is applied to the imprint apparatus, the relative displacement between the mold and the substrate may occur while scanning the light source, that is, while irradiating the resin supplied (applied) to a wide range on the substrate with light. In this case, overlay accuracy causes location dependence within a substrate plane and brings about a pattern transfer error.

SUMMARY OF INVENTION

The present invention provides an imprint apparatus advantageous in reducing the displacement between a mold and a substrate.

According to one aspect of the present invention, there is provided an imprint apparatus which performs an imprint process of forming a pattern on a substrate by molding an imprint material on the substrate using a mold, the apparatus including a measurement unit configured to measure relative positions of the mold and the substrate, a light source unit configured to emit light for curing the imprint material, a scanning unit configured to scan light from the light source unit on the substrate, and a control unit configured to control the imprint process, wherein the control unit performs the imprint process by causing the scanning unit to scan the light while partially aligning the mold and the substrate with each other based on a measurement result of the measurement unit.

Further aspects of the present invention will become apparent from the following description of exemplary embodiments with reference to the attached drawings.

BRIEF DESCRIPTION OF DRAWINGS

FIGS. 5A to 5F are views for explaining an imprint process according to the second embodiment.

DESCRIPTION OF EMBODIMENTS

Figure 1:
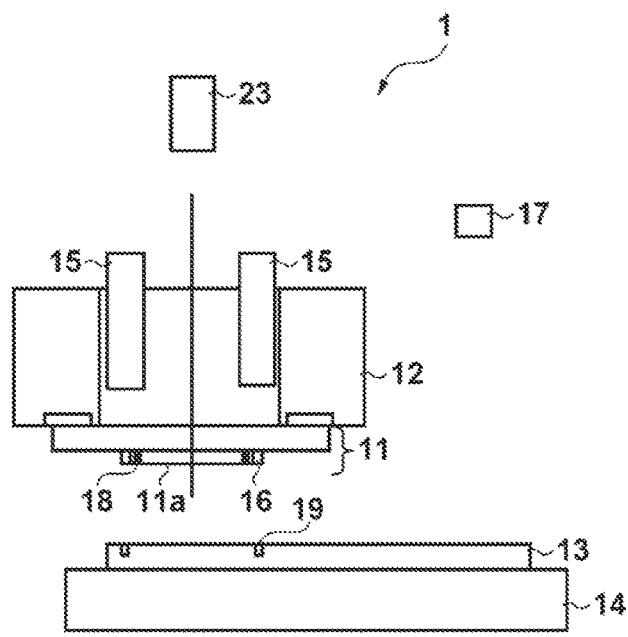
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic view showing the arrangement of an imprint apparatus 1 according to an aspect of the present invention. The imprint apparatus 1 performs an imprint process of forming a pattern on a substrate by molding and curing an imprint material on the substrate using a mold (die) and releasing (separating) the mold from the cured imprint material. In this embodiment, a resin is used as the imprint material and a photo-curing method of curing the resin by ultraviolet-light irradiation is adopted as a resin-curing method.

The imprint apparatus 1 includes a mold holding unit 12 which holds a mold 11, a substrate holding unit 14 which holds a substrate 13, detection units 15, shape correction units 16, a control unit 17, an observation unit 23, a light source unit 24, and a scanning unit 29. The imprint apparatus 1 also includes a resin supply unit including a dispenser configured to supply the resin onto the substrate, a bridge plate configured to hold the mold holding unit 12, and a base plate configured to hold the substrate holding unit 14.

The mold 11 has a pattern surface 11a on which a pattern (three-dimensional pattern) that should be transferred onto the substrate 13 (the resin thereon) has been formed. The mold 11 is made of a material such as quartz which transmits ultraviolet light for curing the resin on the substrate. Mold-side marks (alignment marks) 18 are formed on the pattern surface 11a of the mold 11.

The mold holding unit 12 is a holding mechanism which holds the mold 11. The mold holding unit 12 includes, for example, a mold chuck which vacuum-chucks or electrostatically chucks the mold 11, a mold stage on which the mold chuck is placed, and a driving system which drives (moves) the mold stage. The driving system drives the mold stage (that is, the mold 11) in at least the z-axis direction (the pressing direction in which the mold 11 is pressed against the resin on the substrate). The driving system may have a function of driving the mold stage not only in the z-axis direction but also in the x-axis direction, the y-axis direction, and the θ (rotation around the z-axis) direction.

The substrate 13 is a substrate onto which the pattern of the mold 11 is transferred and includes, for example, a single-crystal silicon substrate or SOI (Silicon on Insulator) substrate. The resin is supplied (applied) onto the substrate 13 from the resin supply unit. Substrate-side marks (alignment marks) 19 are formed respectively in a plurality of shot regions on the substrate 13.

The substrate holding unit 14 is a holding mechanism which holds the substrate 13. The substrate holding unit 14 includes, for example, a substrate chuck which vacuum-chucks or electrostatically chucks the substrate 13, a substrate stage on which the substrate chuck is placed, and a driving system which drives (moves) the substrate stage. The driving system drives the substrate stage (that is, the substrate 13) in at least the x-axis direction and the y-axis direction (a direction perpendicular to the pressing direction of the mold 11). The driving system may have a function of driving the substrate stage not only in the x-axis direction and the y-axis direction but also in the z-axis direction and the θ (rotation around the z-axis) direction.

In this embodiment, each detection unit 15 functions as a measurement unit which measures the relative positions of the mold 11 and the substrate 13. Each detection unit 15 includes a scope which optically detects (observes) the mold-side marks 18 formed on the mold 11 and the substrate-side marks 19 formed respectively in the plurality of shot regions on the substrate 13. Each detection unit 15 obtains the relative positions of the mold 11 and the substrate 13 based on the detection result of the scope. However, each detection unit 15 suffices to detect the relative positional relationship between the mold-side marks 18 and the substrate-side marks 19. Therefore, each detection unit 15 may include a scope which includes an optical system configured to capture two marks simultaneously or may include a scope which detects a signal reflecting the relative positional relationship such as the interference signal or moiré of the two marks. The detection units 15 may be unable to detect the mold-side marks 18 and the substrate-side marks 19 simultaneously. For example, each detection unit 15 may detect the relative positional relationship between the mold-side marks 18 and the substrate-side marks 19 by obtaining the respective positions of the mold-side marks 18 and the substrate-side marks 19 with respect to a reference position arranged inside.

The observation unit 23 includes a camera and has a function of observing (checking) a cured state of the imprint material on the substrate by ultraviolet-light irradiation. The observation unit 23 can also observe, in addition to a cured state of the resin on the substrate, a pressing state of the mold 11 with respect to the resin on the substrate, a filling state of the mold 11 with the resin on the substrate, and a separating state of the mold 11 from the cured resin on the substrate.

The control unit 17 includes a CPU and a memory, and controls the overall (respective units of) the imprint apparatus 1. The control unit 17 controls the imprint process and a process associated with it. In this embodiment, the control unit 17 performs the imprint process while partially aligning the mold 11 and the substrate 13 with each other based on the detection result (that is, the measurement result of the relative positions of the mold 11 and the substrate 13) of each detection unit 15. Furthermore, the control unit 17 controls, when performing the imprint process, the deformation amount of the pattern surface 11a of the mold 11 (shape correction of the mold 11) by each shape correction unit 16.

The mold-side marks 18 and the substrate-side marks 19 serving as the alignment marks used for alignment between the mold 11 and the substrate 13 will be described with reference to FIGS. 2A and 2B. In this embodiment, six chip regions are arranged in one shot region on the substrate 13.

Figure 2A:
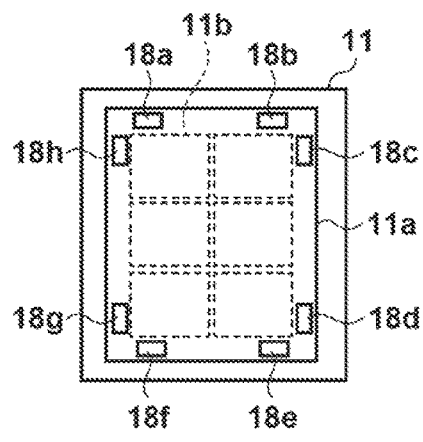
FIGS. 2A and 2B are schematic views showing an example of mold-side marks provided with a mold and substrate-side marks provided with a substrate.

FIG. 2A shows mold-side marks 18a to 18h provided with the pattern surface 11a of the mold 11, or more specifically, at the four corners of the pattern surface 11a. Referring to FIG. 2A, the mold-side marks 18a, 18b, 18e, and 18f having the longitudinal direction in the horizontal direction have the measurement direction in the x-axis direction. On the other hand, the mold-side marks 18c, 18d, 18g, and 18h having the longitudinal direction in the vertical direction have the measurement direction in the y-axis direction. In FIG. 2A, a region surrounded by dotted lines represents a pattern region 11b in which a pattern that should be transferred to each of six chip regions on the substrate is formed.

Figure 2B:
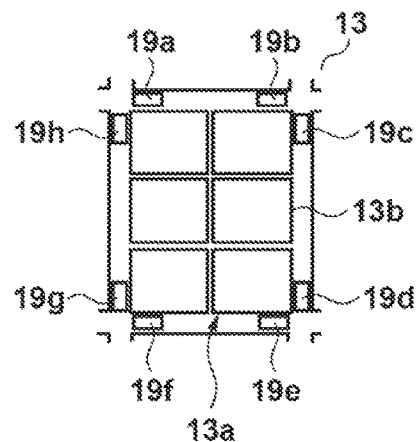

FIG. 2B shows substrate-side marks 19a to 19h provided on the periphery of one shot region 13a on the substrate 13, or more specifically, at the four corners of the shot region 13a. Referring to FIG. 2B, the substrate-side marks 19a, 19b, 19e, and 19f having the longitudinal direction in the horizontal direction have the measurement direction in the x-axis direction. On the other hand, the substrate-side marks 19c, 19d, 19g, and 19h having the longitudinal direction in the vertical direction have the measurement direction in the y-axis direction. In FIG. 2B, a region surrounded by solid lines inside the shot region 13a represents a chip region 13b.

When performing the imprint process, that is, when bringing the mold 11 and the resin on the substrate into contact with each other, the respective mold-side marks 18a to 18h provided with the mold 11 and the respective substrate-side marks 19a to 19h provided with the substrate 13 come close to each other. Therefore, comparison between the position and the shape of the pattern surface 11a of the mold 11, and the position and the shape of the shot region 13a on the substrate 13 can be made by causing the detection units 15 to detect the mold-side marks 18 and the substrate-side marks 19. If a difference (shift) occurs between the position and the shape of the pattern surface 11a of the mold 11, and the position and the shape of the shot region 13a on the substrate 13, overlay accuracy decreases, thereby bringing about a pattern transfer error (product defect).

The imprint process of transferring the pattern of the mold 11 onto the substrate (the resin thereon), that is, forming the pattern on the substrate will be described with reference to FIGS. 3A to 3C.

Figure 3A:
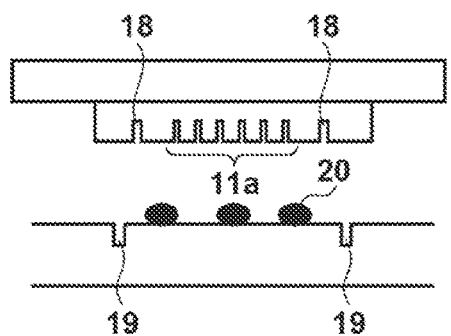
FIGS. 3A to 3C are views for explaining an imprint process.

First, as shown in FIG. 3A, a resin 20 is supplied to a target shot region (a shot region where the imprint process is to be performed from now on) on the substrate by the time pressing of the mold 11 is started. Because of its high volatility, the resin generally used in the imprint apparatus is supplied onto the substrate immediately before performing the imprint process. However, a resin having low volatility may be supplied onto the substrate in advance by spin coating or the like. In addition to supplying the resin 20 onto the substrate, the relative positions of the mold-side marks 18 and the substrate-side marks 19 are detected and based on that detection result, alignment between the mold 11 and the substrate 13 and shape correction of the mold 11 are performed, as described above.

Figure 3B:
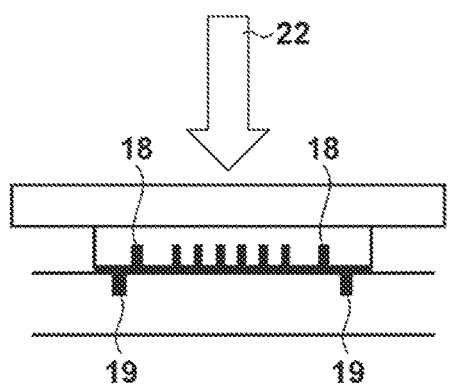

Next, as shown in FIG. 3B, the mold 11 and the resin 20 on the substrate are brought into contact with each other, thereby filling the pattern of the mold 11 with the resin 20. At this time, since the resin 20 transmits visible light, the detection units 15 can detect the substrate-side marks 19. As described above, the mold 11 is made of the material such as quartz which transmits ultraviolet light. Therefore, the difference in refractive index between the mold 11 and the resin 20 is small, and the detection units 15 may be unable to detect the mold-side marks 18 if the mold-side marks 18 are formed by only the three-dimensional structure. Thus, the mold-side marks 18 are coated with a substance having the refractive index and transmittance different from those of the mold 11, or the refractive index of each mold-side marks 18 is changed by ion irradiation or the like. This allows the detection units 15 to detect the mold-side marks 18 even in a state in which the mold 11 and the resin 20 on the substrate are in contact with each other. After the pattern of the mold 11 is filled with the resin 20, the resin 20 is irradiated with ultraviolet light 22 via the mold 11.

Figure 3C:
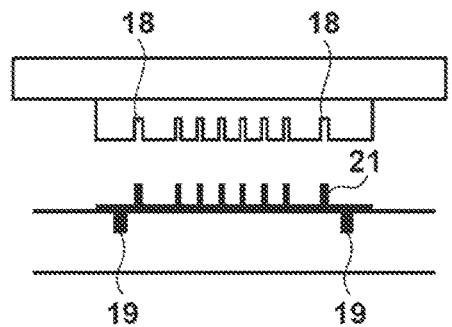

Then, as shown in FIG. 3C, the mold 11 is released from the cured resin 20 on the substrate. By releasing the mold 11 from the cured resin 20 on the substrate, a resin pattern 21 remains on the substrate (that is, the pattern of the mold 11 is transferred onto the substrate).

Recently, in the imprint apparatus, imprint processes are performed simultaneously on the plurality of shot regions on the substrate in order to increase productivity. At this time, an area to which the pattern of the mold is transferred increases, and thus an area irradiated with ultraviolet light also increases. For example, if the imprint process is performed on the entire surface of the substrate at once, the irradiation dose of ultraviolet-light per unit area decreases. As a result, the irradiation dose necessary for curing the resin on the substrate may not be secured. Furthermore, in order to irradiate a large area with ultraviolet light in a limited space within the apparatus, the light source and the optical system which guides light from the light source become complicated and upsized, and thus their arrangements become difficult.

Along with this, a technique of forming a compact light source by light emitting devices such as laser diodes (LEDs) which emit ultraviolet light and scanning the light source is proposed. In the imprint apparatus, however, a comparatively long time is required to transfer the pattern of the mold to the large area, and thus highly accurate alignment between the mold and the substrate needs to be maintained.

If irradiation with the ultraviolet light 22 is performed from above the mold holding unit 12 as in the conventional imprint apparatus, portions (regions) not irradiated with ultraviolet light because of the detection units 15 occur on the substrate. Therefore, the detection units 15 need to be retracted (be driven and retreated) from the optical path of the ultraviolet light 22 before irradiation with the ultraviolet light 22, thus complicating the sequence of the imprint process. In addition, if ultraviolet-light irradiation is performed from above the mold holding unit 12, the ultraviolet-light is dispersed over a wide range, and thus the optical system configured to correct the dispersion is needed.

This embodiment provides the imprint process of forming the pattern on the substrate using the simple light source unit which performs irradiation with ultraviolet light for curing the resin without reducing productivity and alignment accuracy (overlay accuracy) between the mold 11 and the substrate 13. In this embodiment, a description will be made on a case in which a particularly great effect is obtained, or more specifically, a case in which the imprint process is performed on the entire surface of the substrate 13 at once. However, the present invention is not limited to this. The same effect can also be obtained in a case in which, for example, the imprint process is performed on a small region (one or several shot regions) on the substrate 13.

Figure 4A:
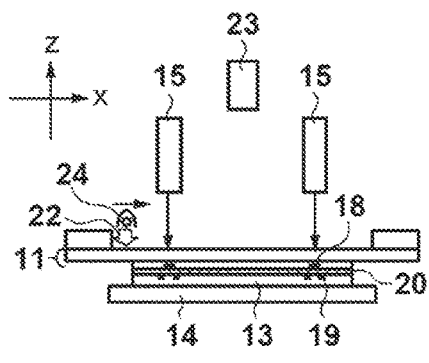
FIGS. 4A to 4H are views for explaining the imprint process according to the first embodiment.
Figure 4B:
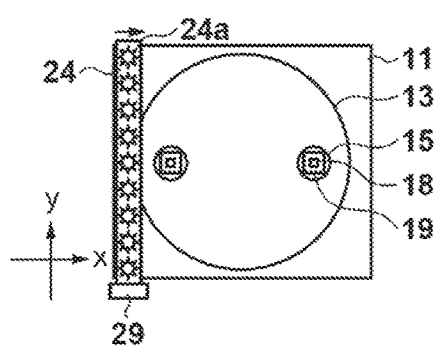

The imprint process according to this embodiment will be described with reference to FIGS. 4A to 4H. FIGS. 4A and 4B show the state in which the mold 11 and the resin 20 on the substrate are in contact with each other. FIG. 4A shows the state when viewed from the side surface and FIG. 4B shows the state when viewed from above. The detection units 15 detect the mold-side marks 18 and the substrate-side marks 19, and obtain the relative positions of the mold 11 and the substrate 13. Based on the relative positions of the mold 11 and the substrate 13 obtained by the detection units 15, the control unit 17 drives at least one of the mold holding unit 12 and the substrate holding unit 14 to perform alignment between the mold 11 and the substrate 13. Irradiation with the ultraviolet light 22 for curing the resin 20 on the substrate is started after the relative positions of the mold 11 and the substrate 13 satisfy a predetermined threshold.

In this embodiment, the resin 20 on the substrate is irradiated with the ultraviolet light 22 sequentially while moving the light source unit 24 by the scanning unit 29. The light source unit 24 is arranged between the detection units 15 and the mold 11, and has a function of performing irradiation with the ultraviolet light 22 for curing the resin 20. In this embodiment, the light source unit 24 is formed by a plurality of LEDs 24a which emit the ultraviolet light 22. More specifically, the light source unit 24 is formed by arraying the plurality of LEDs 24a in a direction (y-axis direction) perpendicular to the scanning direction (x-axis direction) of the scanning unit 29 which scans the substrate with the ultraviolet light 22 from the light source unit 24. However, the light source unit 24 may be formed by arraying a plurality of fibers which guide and emit light having a predetermined wavelength emitted by a lamp (mercury lamp or the like) or by guiding light using an optical member such as a lens or a mirror. In this embodiment, the scanning unit 29 is formed by a moving mechanism such as a slider which moves the light source unit 24. However, the scanning unit 29 suffices to have an arrangement in which the ultraviolet light 22 from the light source unit 24 can be scanned on the substrate and any arrangement known in the art can be applied to the scanning unit 29. It is possible to secure an irradiation region in the longitudinal direction (y-axis direction) by forming the light source unit 24 by the plurality of LEDs 24a and irradiate the entire surface (predetermined range) of the substrate with the ultraviolet light 22 by moving the light source unit 24 by the scanning unit 29.

Figure 4C:
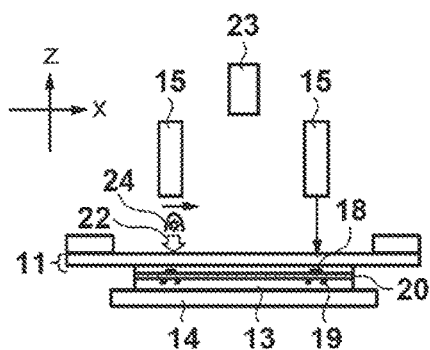
Figure 4D:
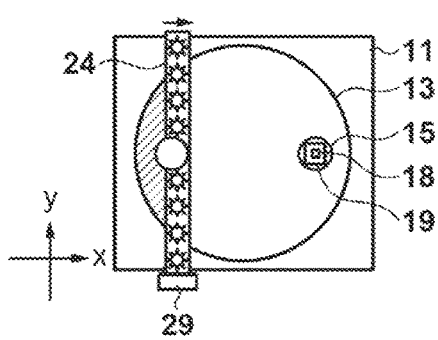
Figure 4E:
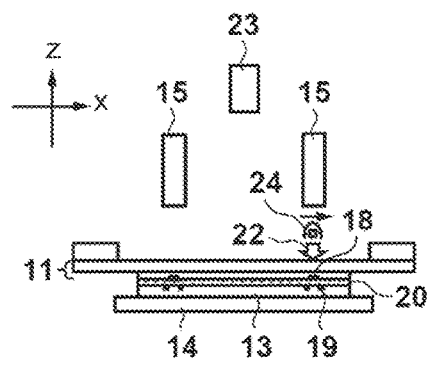
Figure 4F:
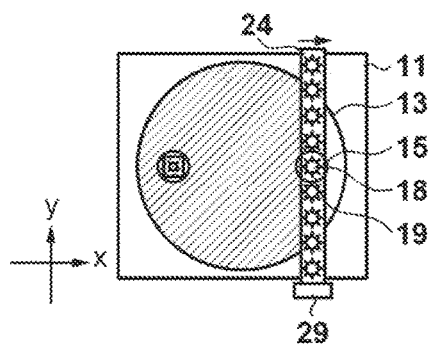
Figure 4G:
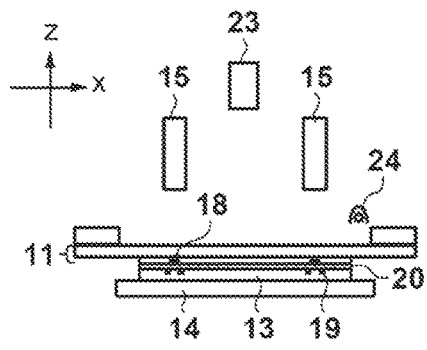
Figure 4H:
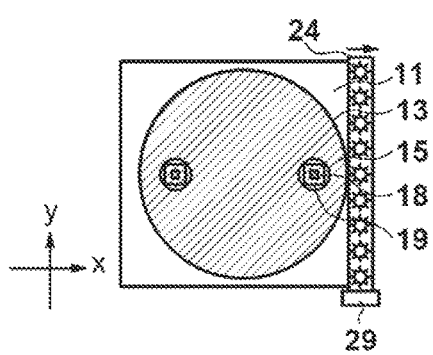

FIGS. 4C to 4H show a state in which the light source unit 24 is moved (that is, the ultraviolet light 22 is scanned on the substrate) while partially aligning the mold 11 and the substrate 13 with each other. FIGS. 4C, 4E, and 4G show the state when viewed from the side surface, and FIGS. 4D, 4F, and 4H show the state when viewed from above. In FIG. 4D, a portion, out of the resin 20 on the substrate, irradiated with the ultraviolet light 22 and cured is indicated by hatch lines.

Considering a case in which irradiation with the ultraviolet light 22 is performed from above the mold holding unit 12 as in the conventional imprint apparatus, the ultraviolet light 22 is blocked by the detection units 15 and the portions not irradiated with the ultraviolet light 22 are formed on the substrate, as described above. If the detection units 15 are driven and retreated, the relative positions of the mold 11 and the substrate 13 cannot be measured even though irradiation with the ultraviolet light 22 is performed (that is, the imprint process is performed). In this case, highly accurate alignment between the mold 11 and the substrate 13 cannot be maintained.

To cope with this, in this embodiment, the light source unit 24 is moved between the detection units 15 and the mold 11. Since the plurality of detection units 15 are arranged in the imprint apparatus 1, one detection unit 15 can measure the relative positions of the mold 11 and the substrate 13 when the light source unit 24 passes under the other detection unit 15. For example, in FIG. 4D, the right detection unit 15 measures the relative positions of the mold 11 and the substrate 13 when the light source unit 24 passes under the left detection unit 15.

The relative positions of the mold 11 and the substrate 13 are fixed after the resin 20 on the substrate is cured by a predetermined area. Therefore, in the state shown in, for example, FIGS. 4E and 4F, the relative positions of the mold 11 and the substrate 13 need not be measured. Note that the degree of curing of the resin 20 on the substrate to fix the relative positions of the mold 11 and the substrate 13 changes depending on the type of resin 20 and the surface substances of the mold 11 and the substrate 13. Therefore, conditions need to be set in advance and defined.

As shown in FIGS. 4G and 4H, after irradiating the entire surface of the substrate 13 with the ultraviolet light 22, the mold 11 is released from the cured resin 20 on the substrate and the imprint process on the substrate 13 ends.

The observation unit 23 successively observes such a state of the imprint process, that is, the state shown in FIGS. 4A to 4H. Some resin supplied onto the substrate changes its color by irradiation with the ultraviolet light 22. Therefore, if such a resin is used, the observation unit 23 can observe the cured state of the resin 20 by irradiation with the ultraviolet light 22. In other words, it is possible to check whether the irradiation dose of the ultraviolet light 22 is sufficient by causing the observation unit 23 to observe the cured state of the resin. Then, if the irradiation dose of the ultraviolet light 22 is insufficient, the light source unit 24 is moved again, or the moving velocity or the light amount of the light source unit 24 is changed.

As described above, in this embodiment, the imprint process is performed by causing the scanning unit 29 to scan the ultraviolet light 22 from the light source unit 24 while partially aligning the mold 11 and the substrate 13 with each other based on the relative positions of the mold 11 and the substrate 13 obtained by the detection units 15. At this time, alignment between a portion of the mold 11 and a portion of the substrate 13 corresponding to the portion of the mold 11 is performed sequentially, and a portion where alignment has been performed undergoes the imprint process first. Also, alignment between a portion on the substrate which does not undergo the imprint process and the portion of the mold 11 corresponding to the portion on the substrate is performed while the scanning unit 29 scans the ultraviolet light 22 from the light source unit 24. This allows the imprint apparatus 1 to maintain highly accurate alignment between the mold 11 and the substrate 13 (reduce the displacement between the mold 11 and the substrate 13) even if the imprint process is performed on the wide range on the substrate at once. Therefore, the imprint apparatus 1 can suppress a decrease in overlay accuracy and reduce the pattern transfer error (product defect).

Second Embodiment

The conventional imprint apparatus also provides a technique of expelling a gas between the mold and the substrate and reducing the gas to be taken by deforming (bending) the mold (pattern surface) into a convex shape with respect to the substrate when bringing the mold and the resin on the substrate into contact with each other. Such a technique is disclosed in, for example, Japanese PCT National Publication No. 2009-536591. This embodiment provides, in this technique, an imprint process of forming a pattern by curing a resin on a substrate stepwise.

In this embodiment, an imprint apparatus 1 further includes a deformation unit which deforms a mold 11 such that the mold 11 has a convex shape on a substrate side. The deformation unit deforms (bends) the mold 11 such that the shape of the mold 11 (pattern surface 11a) on a section perpendicular to the pattern surface 11a of the mold 11 becomes the convex shape on the substrate side. The deformation unit is formed by, for example, a pressure regulating mechanism which regulates (or more specifically, raises) a pressure on the back side of the mold 11 held by a mold holding unit 12 via a pressure regulating port provided in the mold holding unit 12.

The imprint process according to this embodiment will be described with reference to FIGS. 5A to 5F. FIGS. 5A and 5B show a state in which the mold 11 is deformed into the convex shape on the substrate side and brought into contact (wet) with a resin 20 on the substrate. FIG. 5A shows the state when viewed from the side surface and FIG. 5B shows the state when viewed from above. Referring to FIG. 5B, detection units 15 detect mold-side marks 18a and substrate-side marks 19a which are detectable in a state in which a portion (central portion) of the mold 11 contacts the resin, thereby obtaining the relative positions of the mold 11 and a substrate 13. Based on the relative positions of the mold 11 and the substrate 13 obtained by the detection units 15, a control unit 17 drives at least one of the mold holding unit 12 and a substrate holding unit 14 to perform alignment between the mold 11 and the substrate 13. If the entire surface of the substrate 13 is aligned with the mold 11 at once, an alignment target region becomes large. This may widen the relative positional difference between the mold 11 and the substrate 13. To cope with this, in this embodiment, a portion 20a where the mold 11 and the resin 20 on the substrate are in contact with each other in the state shown in FIGS. 5A and 5B is irradiated with ultraviolet light 22 while moving a light source unit 24 by a scanning unit 29.

FIGS. 5C and 5D show a state in which the mold 11 is in contact with (that is, increasingly wet with) the resin 20 on the substrate in a wider range than the state shown in FIGS. 5A and 5B. FIG. 5C shows the state when viewed from the side surface and FIG. 5D shows the state when viewed from the above. At this time, the detection units 15 are driven to detect mold-side marks 18b and substrate-side marks 19b, thereby obtaining the relative positions of the mold 11 and the substrate 13. Based on the relative positions of the mold 11 and the substrate 13 obtained by the detection units 15, the control unit 17 drives at least one of the mold holding unit 12 and the substrate holding unit 14 to perform alignment between the mold 11 and the substrate 13. Then, a portion 20b where the mold 11 and the resin 20 on the substrate are in contact with each other in the state shown in FIGS. 5C and 5D (that is, a further peripheral portion of the portion 20a) is irradiated with the ultraviolet light 22 while moving the light source unit 24 by the scanning unit 29.

FIGS. 5E and 5F specifically show a state in which the entire surface of the mold 11 and the resin 20 on the substrate are in contact with each other in a wider range than the state shown in FIGS. 5C and 5D. FIG. 5E shows the state when viewed from the side surface and FIG. 5F shows the state when viewed from the above. At this time, the detection units 15 are driven to detect mold-side marks 18c and substrate-side marks 19c, thereby obtaining the relative positions of the mold 11 and the substrate 13. Based on the relative positions of the mold 11 and the substrate 13 obtained by the detection units 15, the control unit 17 drives at least one of the mold holding unit 12 and the substrate holding unit 14 to perform alignment between the mold 11 and the substrate 13. Then, a portion 20c where the mold 11 and the resin 20 on the substrate are in contact with each other in the state shown in FIGS. 5E and 5F (that is, a further peripheral portion of the portion 20b) is irradiated with the ultraviolet light 22 while moving the light source unit 24 by the scanning unit 29.

As described above, in this embodiment, the deformation of the mold 11 is controlled such that the contact surface between the mold 11 and the resin 20 on the substrate spreads from the central portion of the substrate 13 in the radial direction. The imprint process is performed by causing the scanning unit 29 to scan the ultraviolet light 22 from the light source unit 24 on the contact surface in accordance with the spread of the contact surface. This allows the imprint apparatus 1 to maintain highly accurate alignment between the mold 11 and the substrate 13 (reduce the displacement between the mold 11 and the substrate 13) even if performing the imprint process on the wide range on the substrate at once. Therefore, the imprint apparatus 1 can suppress a decrease in overlay accuracy and reduce a pattern transfer error (product defect).

If a portion of the resin 20 on the substrate is cured completely, it may become difficult to align the mold 11 and the substrate 13 with each other toward the periphery of the substrate 13. In this case, the irradiation dose of the ultraviolet light 22 which irradiates the resin 20 on the substrate is decreased so as not to cure the resin 20 completely but to increase the viscosity of the resin 20, thereby securing alignment accuracy of the respective portions.

In this embodiment, the case in which the mold 11 is deformed into the convex shape on the substrate side has been described. However, the same effect can also be obtained even if the substrate 13 is deformed into the convex shape on the mold side. In other words, the same effect can also be obtained by deforming either the mold 11 or the substrate 13.

Third Embodiment

Figure 6A:
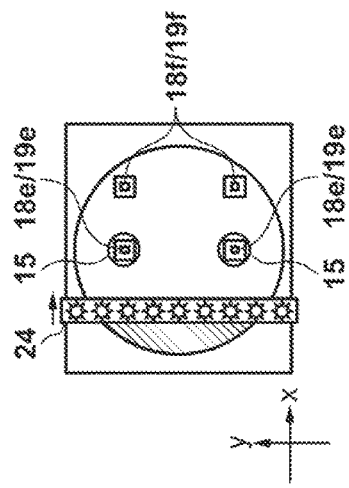
FIGS. 6A and 6B are views for explaining an imprint process according to the third embodiment.
Figure 6B:
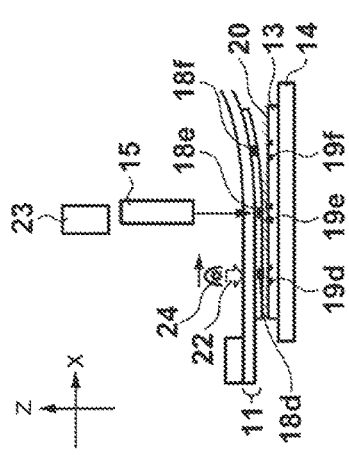

In this embodiment, an imprint process will be described in a case in which a mold 11 and a resin 20 on a substrate are brought into contact with each other such that the contact surface between the mold 11 and the resin 20 on the substrate spreads from the peripheral portion to a central portion of a substrate 13. As shown in FIGS. 6A and 6B, assume that the left peripheral portion of the mold 11 and the resin 20 on the substrate are in contact with each other, and the contact surface is increased toward the right gradually.

The imprint process according to this embodiment will be described with reference to FIGS. 6A and 6B. FIGS. 6A and 6B show a state in which the mold 11 is deformed (warped) to contact (be wet with) the resin 20 on the substrate. FIG. 6A shows the state when viewed from the side surface and FIG. 6B shows the state when viewed from the above. The detection units 15 detect mold-side marks 18d and substrate-side marks 19d, thereby obtaining the relative positions of the mold 11 and the substrate 13. Based on the relative positions of the mold 11 and the substrate 13 obtained by the detection units 15, a control unit 17 drives at least one of a mold holding unit 12 and a substrate holding unit 14 to perform alignment between the mold 11 and the substrate 13.

Next, the detection units 15 are driven to detect mold-side marks 18e and substrate-side marks 19e, thereby obtaining the relative positions of the mold 11 and the substrate 13. While doing so, a left portion where alignment between the mold 11 and the substrate 13 has been performed is first irradiated with ultraviolet light 22 (that is, a scanning unit 29 scans the ultraviolet light 22 from a light source unit 24).

Then, the detection units 15 are driven to detect mold-side marks 18f and substrate-side marks 19f, thereby obtaining the relative positions of the mold 11 and the substrate 13. While doing so, a further left portion where alignment between the mold 11 and the substrate 13 has been performed is irradiated with the ultraviolet light 22 (that is, the scanning unit 29 scans the ultraviolet light 22 from the light source unit 24).

In this embodiment, the deformation of the mold 11 is controlled such that the contact surface between the mold 11 and the resin 20 on the substrate spreads, with respect to the central portion of the substrate 13, from the peripheral portion on one side to the peripheral portion on the other side. The imprint process is performed by causing the scanning unit 29 to sequentially scan the ultraviolet light 22 from the light source unit 24 on the contact surface in accordance with the spread of the contact surface. This allows the imprint apparatus 1 to maintain highly accurate alignment between the mold 11 and the substrate 13 (reduce the displacement between the mold 11 and the substrate 13) even if performing the imprint process on the wide range on the substrate at once. Therefore, the imprint apparatus 1 can suppress a decrease in overlay accuracy and reduce a pattern transfer error (product defect).

In this embodiment, the relative positions of the mold 11 and the substrate 13 are measured sequentially, and then irradiation with the ultraviolet light 22 is performed sequentially. In other words, a mark serving as a detection target is selected from the plurality of mold-side marks 18e and the substrate-side marks 19e in accordance with the scan of the ultraviolet light 22 performed by the scanning unit 29. This allows the imprint apparatus 1 to increase its productivity.

In this embodiment, a portion including the mold-side mark and the substrate-side mark that have been detected before is irradiated with the ultraviolet light 22 while a new mold-side mark and substrate-side mark are detected. However, the present invention is not limited to this. In order to maintain alignment accuracy between the mold 11 and the substrate 13, detection may be continued until a portion including the mold-side mark and the substrate-side mark under detection is irradiated with the ultraviolet light 22.

Fourth Embodiment

In the first to the third embodiments, so-called die-by-die alignment has been described, in which the mold-side marks 18 and the substrate-side marks 19 are detected as measurement of the relative positions of the mold 11 and the substrate 13, and alignment between the mold 11 and the substrate 13 is performed based on the detection result. However, the present invention can also be applied to so-called global alignment in which the marks on the substrate are detected by an alignment scope, and alignment between a mold 11 and a substrate 13 is performed with accuracy of a position measurement device such as an interferometer or an encoder which measures the position of a substrate stage or a mold stage.

Figure 7:
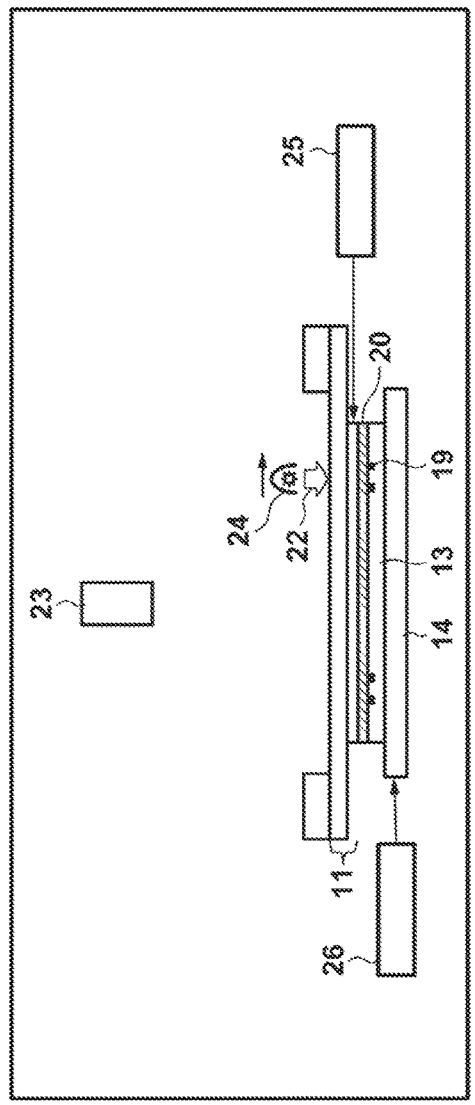
FIG. 7 is a view for explaining an imprint process according to the fourth embodiment.

For example, as shown in FIG. 7, a position measurement unit 25 which accurately measures the position of the mold 11 and a position measurement unit 26 which accurately measures the position of the substrate 13 are arranged. Then, the relative positions of the mold 11 and the substrate 13 may be obtained from the measurement result of the alignment scope (off-axis scope) (not shown) and the measurement results of the position measurement units 25 and 26, thereby performing alignment between the mold 11 and the substrate 13. While a scanning unit 29 scans the ultraviolet light 22 from a light source unit 24, the relative positions of the mold 11 and the substrate 13 are obtained using the position measurement units 25 and 26, and alignment between the mold 11 and the substrate 13 is performed.

The case in which the imprint process is performed on the entire surface of the substrate 13 at once has been described above. However, the present invention is not limited to this. The same effect can also be obtained in a case in which, for example, the imprint process is performed on one or several shot regions on the substrate 13.

If high accuracy is needed for alignment between the mold 11 and the substrate 13, it is necessary to detect larger numbers of mold-side marks 18 and substrate-side marks 19. In this case, detection units 15 are arranged in number suitable for the number of mold-side marks 18 provided on the mold 11 or the number of substrate-side marks 19 provided on the substrate 13.

Fifth Embodiment

A method of manufacturing a device (a semiconductor device, a magnetic storage media, a liquid crystal display element, or the like) serving as an article will be described. The manufacturing method includes a step of forming a pattern on a substrate (a wafer, a glass plate, a film-like substrate, or the like) using an imprint apparatus 1. The manufacturing method further includes a step of processing the substrate on which the pattern has been formed. The processing step can include a step of removing the residual film of the pattern. The processing step can also include another known step such as a step of etching the substrate using the pattern as a mask. The method of manufacturing the article according to this embodiment is advantageous in at least one of the performance, the quality, the productivity, and the production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-119110 filed on Jun. 9, 2014, which is hereby incorporated by reference herein in its entirety.

The invention claimed is:

1. An apparatus which performs a process of molding a material on a substrate using a mold, the apparatus comprising:
   a measurement unit configured to measure relative positions of the mold and the substrate;
   a light source unit configured to emit light for curing the material;
   a scanning unit configured to move the light source unit so as to scan the substrate with light from the light source unit; and
   a control unit configured to control the process,
   wherein the control unit performs the process by causing the scanning unit to move the light source unit so as to scan the substrate with the light while partially aligning the mold and the substrate with each other based on a measurement result of the measurement unit.

2. The apparatus according to claim 1, wherein the control unit sequentially performs alignment between a portion of the mold and a portion of the substrate corresponding to the portion of the mold based on the measurement result of the measurement unit, and performs the process, from a portion where alignment has been performed, by causing the scanning unit to scan the light.

3. The apparatus according to claim 2, wherein the control unit performs alignment between a portion on the substrate where the process has not been performed and a portion of the mold corresponding to the portion on the substrate where the process has not been performed based on the measurement result of the measurement unit while causing the scanning unit to scan the light.

4. The apparatus according to claim 1, further comprising a deformation unit configured to deform the mold such that the mold has a convex shape on a side of the substrate,
   wherein the control unit controls deformation of the mold by the deformation unit such that a contact surface between the mold and the material on the substrate spreads from a central portion of the substrate in a radial direction, and performs the process by causing the scanning unit to sequentially scan the light on the contact surface in accordance with a spread of the contact surface.

5. The apparatus according to claim 1, further comprising a deformation unit configured to deform the mold,
   wherein the control unit controls deformation of the mold by the deformation unit such that a contact surface between the mold and the material on the substrate spreads, with respect to a central portion of the substrate, from a peripheral portion on one side to a peripheral portion on the other side, and performs the process by causing the scanning unit to sequentially scan the light on the contact surface in accordance with a spread of the contact surface.

6. The apparatus according to claim 1, wherein the measurement unit
   includes a scope configured to detect a mark provided with the mold and a mark provided with the substrate, and
   obtains the relative positions based on a detection result of the scope.

7. The apparatus according to claim 6, wherein a plurality of marks detected by the measurement unit are provided with each of the mold and the substrate, and
   the measurement unit selects, with respect to each of the mold and the substrate, a mark serving as a detection target from the plurality of marks in accordance with a scan of the light by the scanning unit.

8. The apparatus according to claim 1, wherein the measurement unit
includes interferometers configured to detect a position of the mold and a position of the substrate, respectively, and
obtains the relative positions based on a detection results of the interferometers.

9. The apparatus according to claim 1, further comprising an observation unit configured to observe a cured state of the material on the substrate by irradiation with the light from the light source unit.

10. The apparatus according to claim 1, wherein the light source unit includes a plurality of light sources arrayed in a direction perpendicular to a scanning direction of the scanning unit.

11. The apparatus according to claim 10, wherein each of the plurality of light sources is formed by an LED or a lamp and an optical member configured to guide light from the lamp and causes the light from the lamp to emerge.

12. The apparatus according to claim 1, wherein the scanning unit moves the light source unit between the measurement unit and the mold.

13. An apparatus which performs a process of molding a material on a substrate using a mold, the apparatus comprising:
a detection unit configured to detect a mark provided with the mold and a mark provided with the substrate;
a light source unit configured to emit light for curing the material; and
a scanning unit configured to move the light source unit between the detection unit and the mold so as to scan the substrate with light from the light source unit on the substrate.

14. The apparatus according to claim 13, further comprising a control unit configured to perform the process by causing the scanning unit to move the light source unit so as to scan the substrate with the light while partially aligning the mold and the substrate based on a detection result of the detection unit.

15. A method of manufacturing an article, the method comprising:
forming a pattern on a substrate using an apparatus; and
processing the substrate on which the pattern has been formed,
wherein the apparatus performs a process of forming the pattern on the substrate by molding a material on the substrate using a mold, and includes:
a measurement unit configured to measure relative positions of the mold and the substrate;
a light source unit configured to emit light for curing the material;
a scanning unit configured to move the light source unit so as to scan the substrate with light from the light source unit on the substrate; and
a control unit configured to control the process,
wherein the control unit performs the process by causing the scanning unit to move the light source unit so as to scan the substrate with the light while partially aligning the mold and the substrate with each other based on a measurement result of the measurement unit.

16. A method of manufacturing an article, the method comprising:
forming a pattern on a substrate using an apparatus; and
processing the substrate on which the pattern has been formed,
wherein the apparatus performs a process of forming the pattern on the substrate by molding a material on the substrate using a mold, and includes:
a detection unit configured to detect a mark provided with the mold and a mark provided with the substrate;
a light source unit configured to emit light for curing the material; and
a scanning unit configured to move the light source unit between the detection unit and the mold so as to scan the substrate with light from the light source unit on the substrate.

* * * * *